United States Patent
Micks et al.

(10) Patent No.: US 10,474,964 B2
(45) Date of Patent: Nov. 12, 2019

(54) TRAINING ALGORITHM FOR COLLISION AVOIDANCE

(71) Applicant: Ford Global Technologies, LLC, Dearborn, MI (US)

(72) Inventors: Ashley Elizabeth Micks, Mountain View, CA (US); Jinesh J Jain, San Mateo, CA (US); Harpreetsingh Banvait, Sunnyvale, CA (US); Kyu Jeong Han, Palo Alto, CA (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 820 days.

(21) Appl. No.: 15/007,024

(22) Filed: Jan. 26, 2016

(65) Prior Publication Data

US 2017/0213149 A1   Jul. 27, 2017

(51) Int. Cl.
*G06N 20/00*   (2019.01)
*B60W 30/09*   (2012.01)
(Continued)

(52) U.S. Cl.
CPC ........... *G06N 20/00* (2019.01); *B60W 30/09* (2013.01); *G06F 17/5009* (2013.01);
(Continued)

(58) Field of Classification Search
CPC ..... G06N 99/005; G06N 3/058; B60W 30/09; G06F 17/5009; G06K 9/00805;
(Continued)

(56) References Cited

U.S. PATENT DOCUMENTS 5,619,616 A * 4/1997 Brady ............. G01H 3/08
706/20
5,798,983 A * 8/1998 Kuhn ............. H04B 11/00
367/127

(Continued)

FOREIGN PATENT DOCUMENTS

EP 0757799 B1 8/1998
EP 0877309 B1 6/2000

OTHER PUBLICATIONS

Foggia et al., "Audio Surveillance of Roads: A System for Detecting Anomalous Sounds", Nov. 5, 2015, IEEE Transactions on Intelligent Transportation Systems, vol. 17, No. 1, pp. 279-288 (Year: 2015).*

(Continued)

*Primary Examiner* — Kamran Afshar
*Assistant Examiner* — Brent Johnston Hoover
(74) *Attorney, Agent, or Firm* — David R. Stevens; Stevens Law Group (57) ABSTRACT

A machine learning model is trained by defining a scenario including models of vehicles and a typical driving environment. A model of a subject vehicle is added to the scenario and sensor locations are defined on the subject vehicle. A perception of the scenario by sensors at the sensor locations is simulated. The scenario further includes a model of a lane-splitting vehicle. The location of the lane-splitting vehicle and the simulated outputs of the sensors perceiving the scenario are input to a machine learning algorithm that trains a model to detect the location of a lane-splitting vehicle based on the sensor outputs. A vehicle controller then incorporates the machine learning model and estimates the presence and/or location of a lane-splitting vehicle based on actual sensor outputs input to the machine learning model.

18 Claims, 7 Drawing Sheets

(51) Int. Cl.
    G06F 17/50    (2006.01)
    G06K 9/00     (2006.01)
    G06K 9/66     (2006.01)
    G06N 3/08     (2006.01)
    H04R 29/00    (2006.01)

(52) U.S. Cl.
    CPC ..... *G06K 9/00805* (2013.01); *G06K 9/00825* (2013.01); *G06K 9/66* (2013.01); *G06N 3/088* (2013.01); *H04R 29/00* (2013.01); *H04R 2499/13* (2013.01)

(58) Field of Classification Search
    CPC ...... G06K 9/00825; G06K 9/66; H04R 29/00; G01S 13/931; G01S 13/9325; G01S 13/9371; G01S 13/9375; G01S 13/9378; G01S 13/9389
    See application file for complete search history.

(56)         References Cited

U.S. PATENT DOCUMENTS 6,236,908  B1*  5/2001   Cheng .............. F02D 41/0062
                                                              701/1
    7,379,813  B2   5/2008   Kubota
    7,574,018  B2   8/2009   Luo
    8,949,018  B2   2/2015   Kaminade
    9,892,332  B1   2/2018   Wendel
    2002/0196134 A1* 12/2002 Lutter .................... H04R 5/04
                                                           340/426.1
    2009/0310867 A1* 12/2009 Matei ...................... G06T 7/11
                                                            382/195
    2011/0184895 A1*  7/2011 Janssen ............. G06K 9/00785
                                                             706/12
    2014/0278052 A1   9/2014 Slavin
    2014/0278396 A1*  9/2014 Graumann .......... G10L 21/0205
                                                            704/233
    2014/0354684 A1  12/2014 Beckwith
    2015/0166062 A1*  6/2015 Johnson ................ B60W 30/12
                                                             701/41
    2015/0210274 A1   7/2015 Clarke
    2016/0210383 A1   7/2016 Alaniz
    2016/0306357 A1* 10/2016 Wieskamp ......... B62D 15/0265
    2017/0228606 A1   8/2017 Guan

OTHER PUBLICATIONS

Keyser et al., "A discriminative learning approach to probabilistic acoustic source localization", Sep. 2014, 2014 14th International Workshop on Acoustic Signal Enhancement (IWAENC), pp. 99-103 (Year: 2014).*
Algorithms for Vehicle Classification, Surendra Gupte and Nikolaos P. Papanikolopoulos, Artificial Intelligence, Jul. 2000.
Automated Generation of Virtual Driving Scenarios From Test Drive Data, Robin, van der Made, Martijn, Tidema, Ulrich, Lages, Roman, Katz, Martin, Spencer, Paper No. 15-0268.

* cited by examiner

TRAINING ALGORITHM FOR COLLISION AVOIDANCE

BACKGROUND

Field of the Invention

This invention relates to performing obstacle avoidance in autonomous vehicles.

Background of the Invention

In many congested, urban areas like San Francisco, Calif. or London, UK, motorcyclists often overtake slow or stopped vehicles in the traffic by traveling between lanes, namely lane-splitting. This is a very dangerous driving activity since it is hard for drivers in adjacent vehicles to detect such activities, especially when lanes are merging. Even for future autonomous vehicles, which might have built-in 360 degree sensing systems, it would be challenging to identify fast moving objects like motorcycles changing lanes at much higher relative speeds. This difficulty would hence present challenges to the overall sensing suites and algorithms. It is further problematic where objects or vehicles occlude a sensing system.

The systems and methods disclosed herein provide an approach for detecting lane-splitting vehicles.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1A:
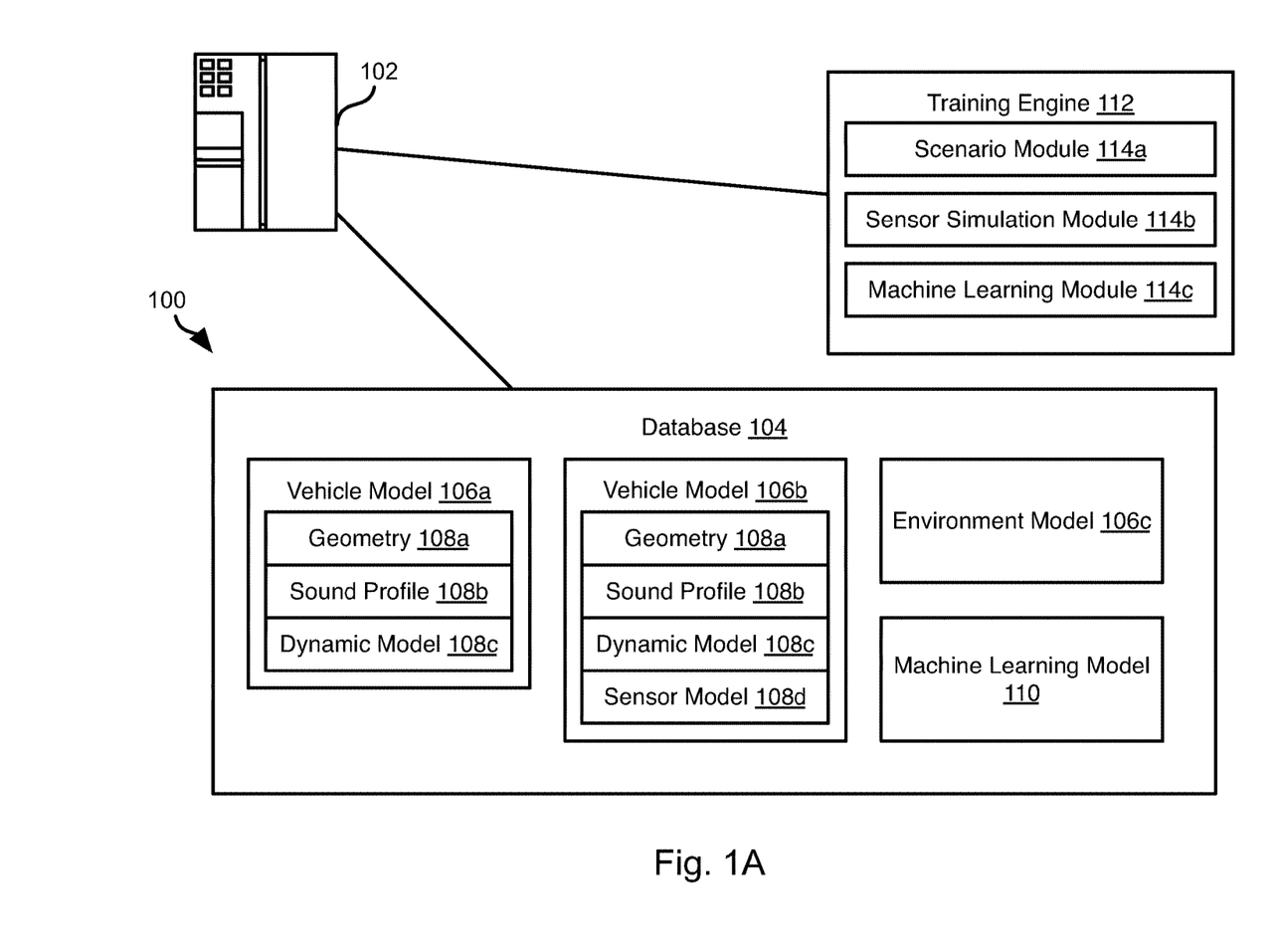
FIGS. 1A and 1B are schematic block diagrams of a system for implementing embodiments of the invention.

Referring to FIG. 1, a network environment 100 may include a server system 102 may host or access a database 104 including data sufficient to define a scenario for training of a detection system. In particular, the database 104 may store vehicle models 106a that include the geometry data 108a of the vehicle, e.g. the shape of the body, tires, and any other visible features of the vehicle. The geometry data 108a may further include material data, such as hardness or material type. The model 106 may further include a sound profile 108b that includes audio files or other data characteristic of sound produced by the vehicle under certain circumstances, e.g. different speeds and different levels of accelerations at different speeds. The vehicle model 106a may further include a dynamic model 108c that indicates operation limits of the vehicle, e.g. turning radius, acceleration profile (maximum acceleration at a particular speed), and the like. The vehicle models 106a may be based on actual vehicles and the fields 108a-108c may be populated using data obtained from measuring the actual vehicles.

In some embodiments, the database 104 may store a vehicle model 106b for a vehicle incorporating one or more sensors that are used for obstacle detection. As described below, the outputs of these sensors may be input to a model that is trained using the models of the database 104. Accordingly, the vehicle model 106b may additionally include a sensor model 108d that indicates the locations of the sensors on the vehicle, the orientations of the sensors, and one or more descriptors of the sensors. For example, for a microphone, the sensor model 108d may include the gain, signal to noise ratio, sensitivity profile (sensitivity vs. frequency), and the like. For a camera, the sensor model 108d may include the field of view, resolution, zoom, frame rate, or other operational limit of the camera. For a LIDAR or RADAR sensor, the sensor model 108d may include a resolution, field of view, and scan rate of the system.

The database 104 may include an environment model 106c that includes models of various landscapes, such models of city streets with intersections, buildings, pedestrians, trees etc. The models may define the geometry and location of objects in a landscape and may further include other aspects such as reflectivity to laser, RADAR, sound, light, etc. in order to enable simulation of perception of the objects by a sensor.

The database 104 may store a machine learning model 110. The machine learning model 110 may be trained using the models 106a-106c according to the methods described herein. The machine learning model 110 may be a deep neural network, Bayesian network, or other type of machine learning model.

The server system 102 may execute a training engine 112. The training engine 112 may include a scenario module 114a. The scenario module 114a may retrieve models 106a-106c and generate a scenario of models of vehicles moving along models of roads. The scenario module 114a may generate these scenarios manually or receive human inputs specifying initial locations of vehicles, velocities of vehicles, etc. In some embodiments, scenarios may be modeled based on video or other measurements of an actual location, e.g. observations of a location, movements of vehicles in the location, the location of other objects, etc. As noted above, the systems and methods disclosed herein provide an approach for detecting lane-splitting vehicles. Accordingly, one of the vehicle models 106a may be of a vehicle capable of lane-splitting, e.g. a motorcycle, bicycle, and the like. Accordingly, the scenario module 114a may add models of lane-splitting vehicles to the scenario moving in inter-lane areas between vehicles and moving faster than the vehicles.

The training engine 112 may include a sensor simulation module 114b. In particular, for a scenario, and a vehicle included in the scenario including sensor model data 108d, a perception of the scenario by the sensors may be simulated by the sensor simulation module 114b as described in greater detail below.

The training engine 112 may include a machine learning module 114c. The machine learning module 114c may train the machine learning model 110. For example, the machine learning model 110 may be trained to identify the location of a lane-splitting vehicle by inputting the simulated sensor outputs as well as the location of the model of a lane-splitting vehicle in the scenario. In particular, the sensor outputs may be provided as an input data set and the relative location of the lane-splitting vehicle may be provided as the desired output for the input data set.

Figure 1B:
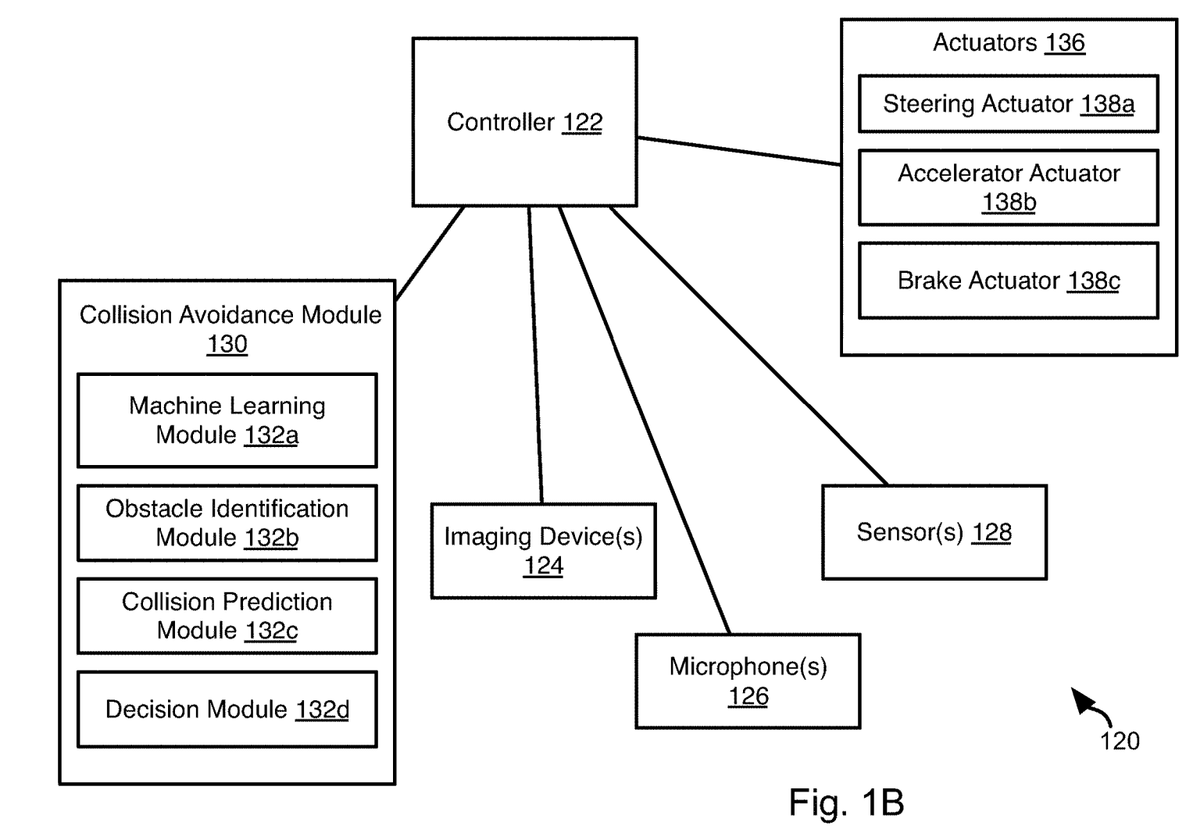

Referring to FIG. 1B, the machine learning model 110 may be used to perform obstacle detection in the illustrated system 120 that may be incorporated into a vehicle, such as an autonomous or human-operated vehicle. For example, the system 120 may include controller 122 housed within a vehicle. The vehicle may include any vehicle known in the art. The vehicle may have all of the structures and features of any vehicle known in the art including, wheels, a drive train coupled to the wheels, an engine coupled to the drive train, a steering system, a braking system, and other systems known in the art to be included in a vehicle.

As discussed in greater detail herein, the controller 122 may perform autonomous navigation and collision avoidance. In particular, image data and audio data may be analyzed to identify obstacles. In particular, sensor outputs may be used to identify vehicles that are not in the field of view of one or more cameras or other imaging sensors, as described in detail below with respect to FIG. 3.

The controller 122 may receive one or more image streams from one or more imaging devices 124. For example, one or more cameras may be mounted to the vehicle and output image streams received by the controller 122. The controller 122 may receive one or more audio streams from one or more microphones 126. For example, one or more microphones or microphone arrays may be mounted to the vehicle and output audio streams received by the controller 122. The microphones 126 may include directional microphones having a sensitivity that varies with angle. In some embodiments, the system 120 may include other sensors 128 coupled to the controller 122, such as LIDAR, RADAR, SONAR, and the like. The locations and orientations of the sensing devices 124, 126, 128 may correspond to those modeled in the sensor model 108d used to train the machine learning model 110.

The controller 122 may execute a collision avoidance module 130 that receives the image streams, audio streams and identifies possible obstacles and takes measures to avoid them. The collision avoidance module 130 may further receive outputs from the sensors 128. The collision avoidance module 130 then analyzes the outputs of the imaging devices 124, microphones 126, and sensors 128 in order to identify potential obstacles The collision avoidance module 130 may include a machine learning module 132a that receives outputs of the imaging devices 124, microphones 126, and sensors 128 and outputs an estimate as to whether the outputs indicate the presence of a lane-splitting vehicle and a direction and or distance to the lane-splitting motorcycle.

The collision avoidance module 130 may further include an obstacle identification module 132b, a collision prediction module 132c, and a decision module 132d. The obstacle identification module 132b analyzes the one or more image streams and identifies potential obstacles, including people, animals, vehicles, buildings, curbs, and other objects and structures. In particular, the obstacle identification module 132b may identify vehicle images in the image stream.

The collision prediction module 132c predicts which obstacle images are likely to collide with the vehicle based on its current trajectory or current intended path. The collision prediction module 132c may evaluate the likelihood of collision with objects identified by the obstacle identification module 132b as well as obstacles detected using the machine learning module 132a. The decision module 132d may make a decision to stop, accelerate, turn, etc. in order to avoid obstacles. The manner in which the collision prediction module 132c predicts potential collisions and the manner in which the decision module 132d takes action to avoid potential collisions may be according to any method or system known in the art of autonomous vehicles.

The decision module 132d may control the trajectory of the vehicle by actuating one or more actuators 136 controlling the direction and speed of the vehicle. For example, the actuators 136 may include a steering actuator 138a, an accelerator actuator 138b, and a brake actuator 138c. The configuration of the actuators 138a-138c may be according to any implementation of such actuators known in the art of autonomous vehicles.

Figure 2:
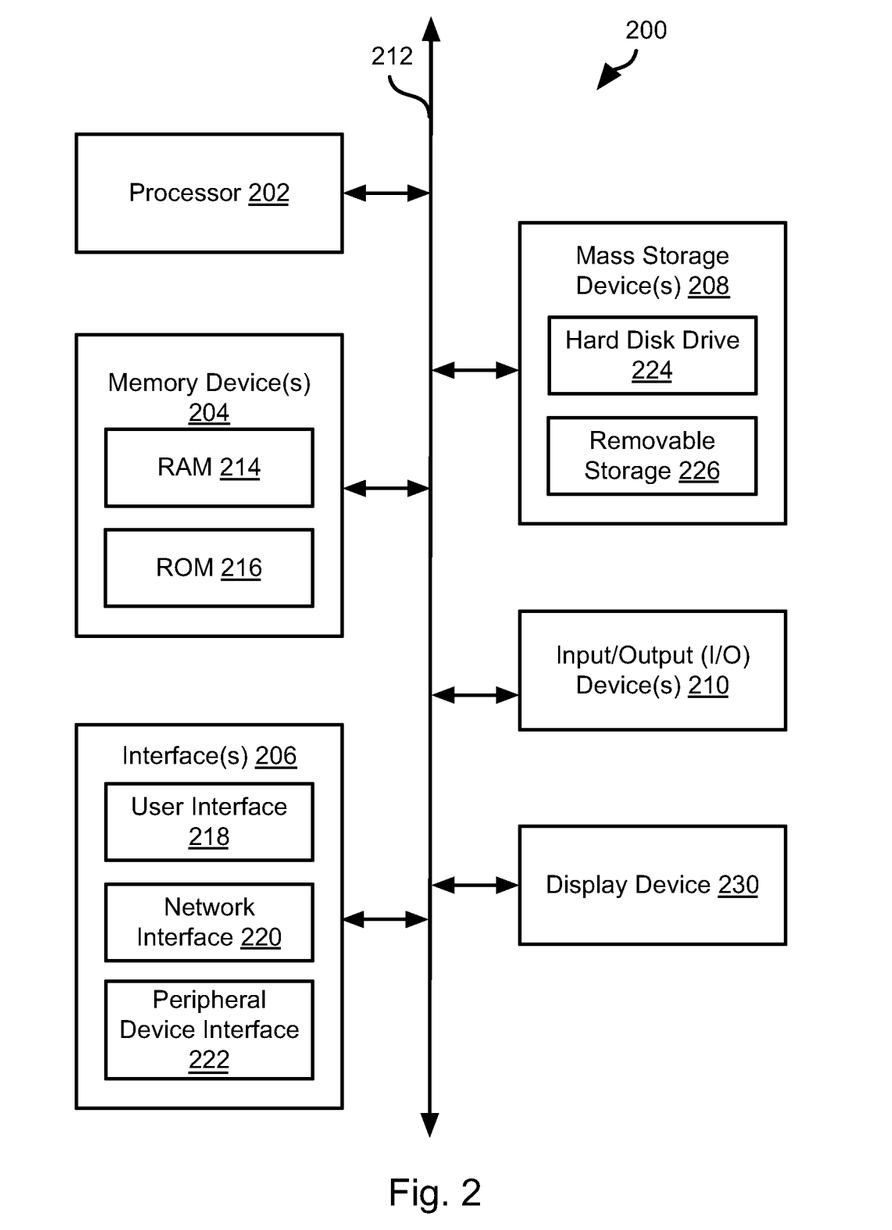
FIG. 2 is a schematic block diagram of an example computing device suitable for implementing methods in accordance with embodiments of the invention.

FIG. 2 is a block diagram illustrating an example computing device 200. Computing device 200 may be used to perform various procedures, such as those discussed herein. The server system 102 and controller 122 may have some or all of the attributes of the computing device 200.

Computing device 200 includes one or more processor(s) 202, one or more memory device(s) 204, one or more interface(s) 206, one or more mass storage device(s) 208, one or more Input/Output (I/O) device(s) 210, and a display device 230 all of which are coupled to a bus 212. Processor(s) 202 include one or more processors or controllers that execute instructions stored in memory device(s) 204 and/or mass storage device(s) 208. Processor(s) 202 may also include various types of computer-readable media, such as cache memory.

Memory device(s) 204 include various computer-readable media, such as volatile memory (e.g., random access memory (RAM) 214) and/or nonvolatile memory (e.g., read-only memory (ROM) 216). Memory device(s) 204 may also include rewritable ROM, such as Flash memory.

Mass storage device(s) 208 include various computer readable media, such as magnetic tapes, magnetic disks, optical disks, solid-state memory (e.g., Flash memory), and so forth. As shown in FIG. 2, a particular mass storage device is a hard disk drive 224. Various drives may also be included in mass storage device(s) 208 to enable reading from and/or writing to the various computer readable media. Mass storage device(s) 208 include removable media 226 and/or non-removable media.

I/O device(s) 210 include various devices that allow data and/or other information to be input to or retrieved from computing device 200. Example I/O device(s) 210 include cursor control devices, keyboards, keypads, microphones, monitors or other display devices, speakers, printers, network interface cards, modems, lenses, CCDs or other image capture devices, and the like.

Display device 230 includes any type of device capable of displaying information to one or more users of computing device 200. Examples of display device 230 include a monitor, display terminal, video projection device, and the like.

Interface(s) 206 include various interfaces that allow computing device 200 to interact with other systems, devices, or computing environments. Example interface(s) 206 include any number of different network interfaces 220, such as interfaces to local area networks (LANs), wide area networks (WANs), wireless networks, and the Internet. Other interface(s) include user interface 218 and peripheral device interface 222. The interface(s) 206 may also include one or more peripheral interfaces such as interfaces for printers, pointing devices (mice, track pad, etc.), keyboards, and the like.

Bus 212 allows processor(s) 202, memory device(s) 204, interface(s) 206, mass storage device(s) 208, I/O device(s) 210, and display device 230 to communicate with one another, as well as other devices or components coupled to bus 212. Bus 212 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 200, and are executed by processor(s) 202. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 3:
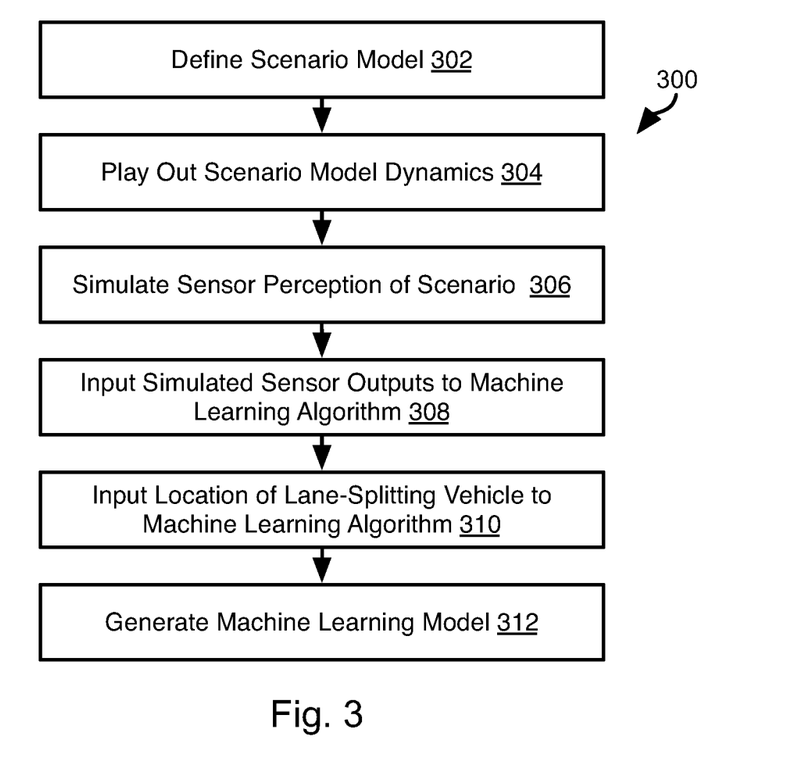
FIG. 3 is a process flow diagram of a method for training a model to detect a lane-splitting vehicle in accordance with an embodiment of the present invention.
Figure 4A:
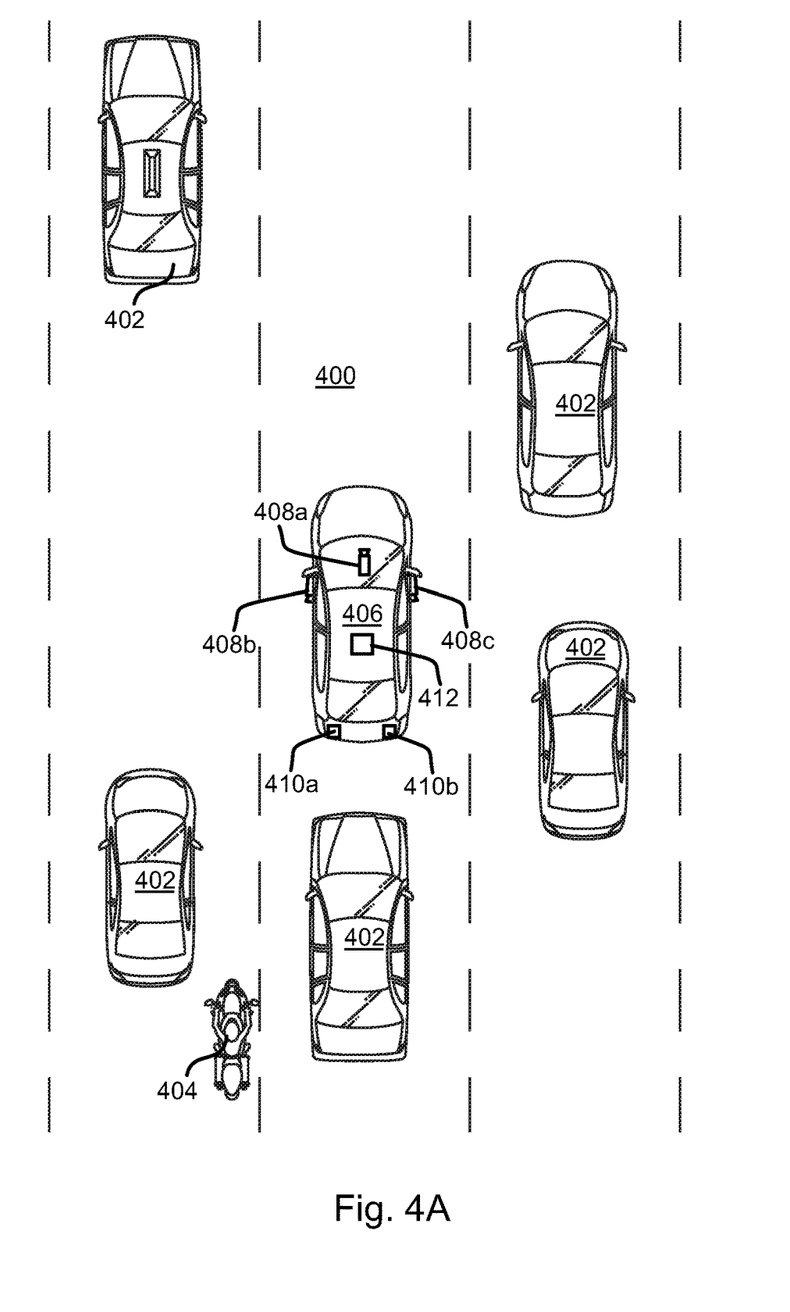
FIGS. 4A and 4B are schematic block diagrams of a scenario for training the model in accordance with an embodiment of the present invention.
Figure 4B:
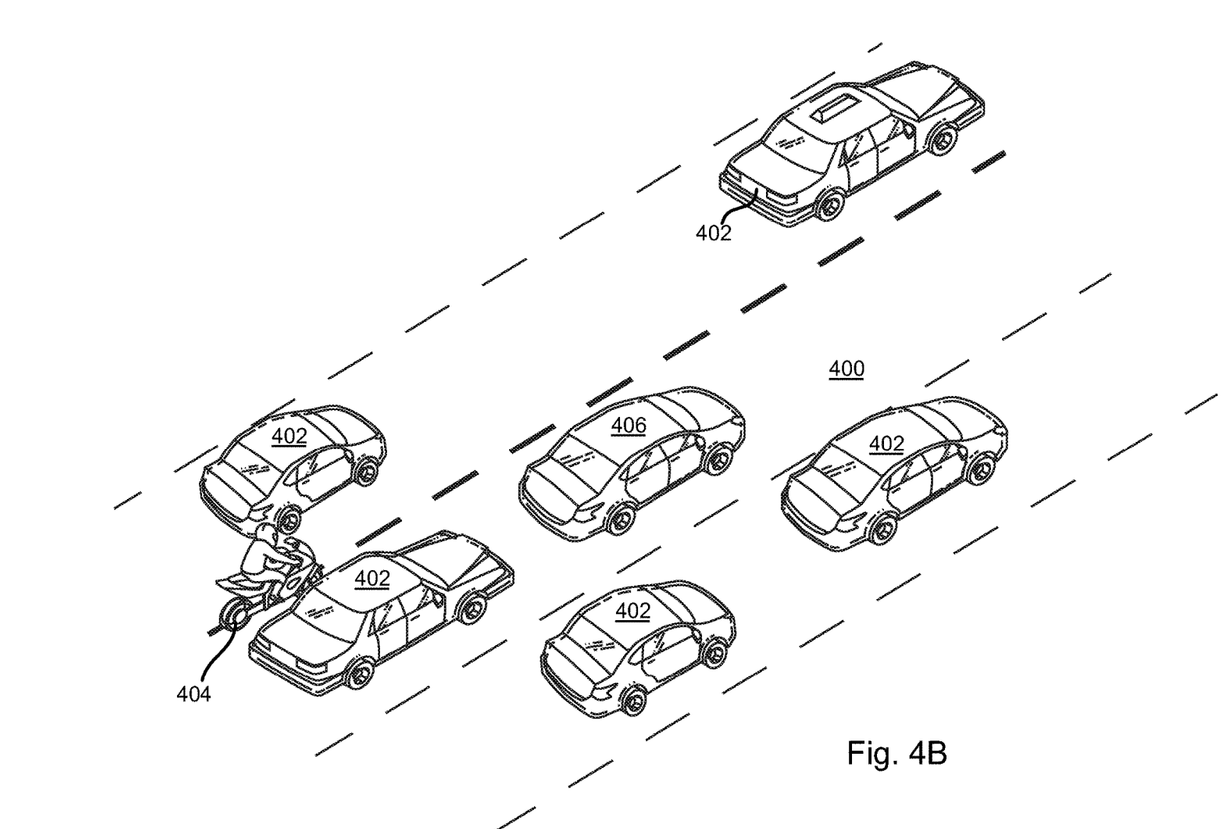

Referring to FIG. 3, the illustrated method 300 may be executed by the server system 102 in order to train the machine learning model 110. The method 300 may including defining 302 a scenario model. For example, as shown in FIGS. 4A and 4B, an environment model including a road 400 may be combined with models of vehicles 402 placed within lanes of the road 400 and having velocities and accelerations that may vary from one time step to the next during propagation of the scenario model. A lane-splitting vehicle 404 may be placed in the model between lanes of vehicles 402 and likewise have a velocity and acceleration that may vary from one time step to the next. In some scenarios, the lane-splitting vehicle travels significantly faster than surrounding vehicles 402.

A subject vehicle 406 may also be placed in the model and may have a velocity and acceleration that varies from one time step to the next. Perception of the scenario by microphones, imaging devices, and/or other sensors may be simulated from the point of view of the subject vehicle 406. In particular locations and orientations of imaging devices 408a-408c, microphones 410a, 410b, and other sensors 412 (e.g. LIDAR, RADAR, SONAR) may be defined on the subject vehicle 406 in accordance with a sensor model 108d.

The method 300 may include playing out 304 the scenario model dynamics. In particular, each vehicle 402, 404, 406 in the model may have a pre-defined velocity or position profile that defines how the velocity and/or profile is to change over time. Accordingly, playing out 304 the scenario may include simulating a plurality of discrete time steps wherein for each time step, each vehicle 402, 404, 406 is moved to different position within the model according to the pre-defined velocity or position profile.

The method 300 may further include simulating 306 sensor perception of the scenario. For example, for each time step, the state of the model (e.g. positions and velocities of the vehicles 402, 404, 406 at that time step) may be captured from the point of view of a particular sensor. In particular, the position of the sensors according to the sensor model 108d on the subject vehicle 406 and the operational capacity of the sensors as defined in the sensor model 108d may be used to simulate a sensor output.

For example, for each imaging device, a rendering of the scenario from the point of view of the imaging device on the subject vehicle 406 may be generated. For a microphone, sound incident on the microphone during the time step as propagated from the vehicles 402, 404, 406 to the location of the microphone on the subject vehicle may be simulated. Simulating sound may include simply simulating the time of travel from a source of the sound and any Doppler effects. Simulating sound may further include simulating reflections off of vehicles, the ground, or buildings that may arrive at the microphone location.

For a LIDAR sensor, a point cloud from the point of view of the LIDAR sensor may be simulated, where the points of the point cloud are points of structures of the environment or vehicles 402, 404, 406 of the scenario that are in the field of view of the LIDAR sensor. In some LIDAR systems, points measured may include both a three-dimensional coordinate and a reflectivity value. In some embodiments, the models 106a, 106b may include reflectivity values for exterior surfaces thereof. Accordingly, for points of the point cloud in the point of view of the LIDAR system, the reflectivity value of the structure including each point may be included. Perception of the scenario model by various other sensors may also be included. For a RADAR or SONAR system, reflections from objects and vehicles of the scenario may be simulated for each time step.

The various sensors may have different frame or scanning rates than the time step of updating the scenario model. Accordingly, more or fewer outputs may be produced then the number of times steps. For example, for sound, the number of samples required in order to accurately simulate detection of sound may be greater than the time step. Accordingly, multiple samples may be taken for each time step. For example, the time step may be subdivided into smaller time steps and simulated samples of sound propagated through the scenario model and incident on the microphone location may be recorded. In a similar manner, images from an imaging device, point clouds from LIDAR, reflections from RADAR or SONAR may be simulated at a different periods that are smaller or larger than the time step.

The result of the simulating of sensor perception at step 306 may be a streams of sensor outputs, e.g. a series of images, an audio signal, a set of point clouds, a sets of reflections at different time points, etc. The streams of sensor outputs may be input 308 to a machine learning algorithm. Likewise, the location of the lane-splitting vehicle 404 may be input 310 to the machine learning algorithm.

For example, for each time step, one or more sensor outputs for each type of sensor that were simulated for that time step may be input 308 to the machine learning algorithm. Likewise, the position of the lane-splitting vehicle 404 at that time step may be input to the model, e.g. the relative position of the vehicle 404 to the vehicle 406 in the scenario model at that time step. For audio signals, the time step may be too short for a meaningful analysis. Accordingly, samples of simulated sound may be input to the model at step 308 for multiple time steps preceding and/or following the each time step, i.e. a window of time steps including the each time step.

The machine learning model 110 may be then be generated 312 by updating the model 110 for the sensor outputs input 308 for each time step and the vehicle 404 location at each time step. The manner in which the machine learning algorithm trains the model 110 may be performed according to any manner known in the art of machine learning. Likewise, the sensor outputs may be input to the machine learning algorithm in a continuous manner rather than as discrete data sets for individual time steps.

The result of the method 300 is a machine learning model 110 that is trained to output for an input stream of data at least one of (a) whether or not a lane-splitting vehicle is perceived near a vehicle, (b) a direction toward the lane-splitting vehicle if any, and (c) a location of the lane-splitting vehicle. Many machine learning algorithms further output a confidence score indicating how the probability that an output of the models is correct. Accordingly, for any of (a)-(c) a corresponding confidence score may also be output by the model.

Figure 5:
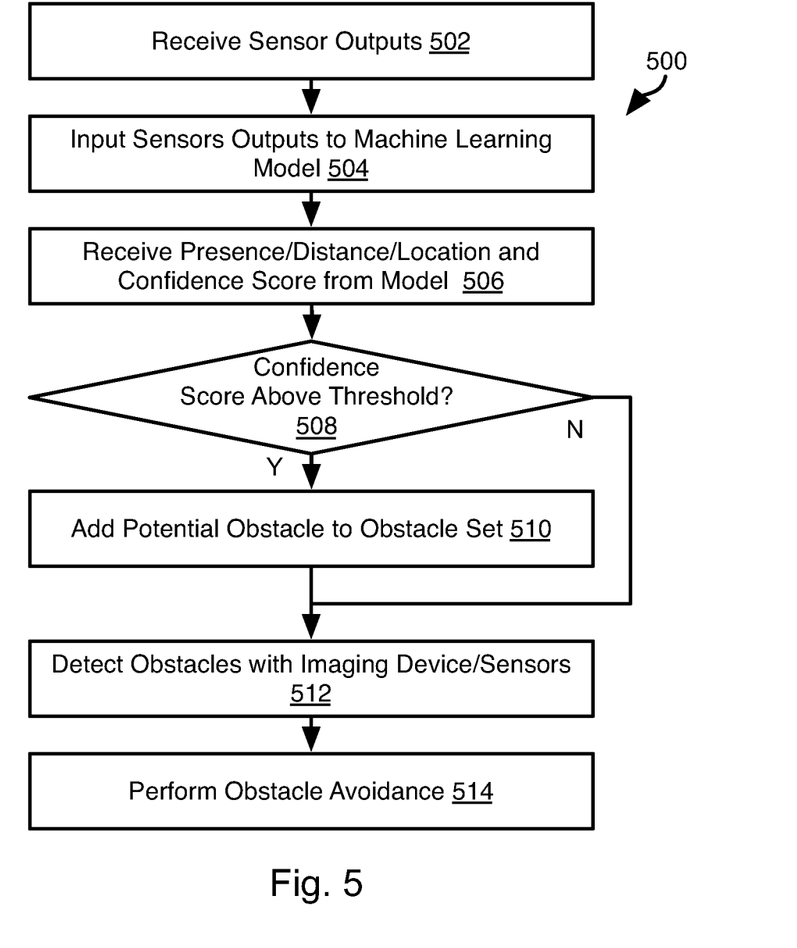
FIG. 5 is a process flow diagram of a method for detecting lane-splitting vehicles in accordance with an embodiment of the present invention.

FIG. 5 illustrates a method 500 for using the machine learning model 110 as trained according to the method 300. The method 500 that may be executed by the controller 122 by processing outputs from the imaging devices 124, microphone 126, and/or other sensors 128. The method 500 may include receiving 502 sensor outputs. As noted above, the imaging devices may product streams of images, the microphones 126 may produce an audio signal, a LIDAR sensor may product a point cloud, and RADAR and SONAR may record reflections of radio and sound, respectively. Some or all of these outputs may therefore be received 502.

The method 500 may further include inputting 504 the sensor outputs into the machine learning model 110 and receiving 506, as an output of the machine learning model 110, some or all of (a) whether or not a lane-splitting vehicle is near the vehicle incorporating the controller 122, (b) a direction toward the lane-splitting vehicle if any, (c) a location of the lane-splitting vehicle relative to the vehicle incorporating the controller 122, and (d) a confidence score for one or more of (a) through (c).

If the confidence score that a lane-splitting vehicle is near is not found 508 to be above a predetermined threshold, e.g. from a value between 70% and 99%, then the output of the machine learning model 110 may be ignored. If the confidence score for one or more of (a) through (c) is found 508 to exceed the threshold, then the lane-splitting vehicle is added 510 to a set of potential obstacles. In particular, a potential obstacle approaching in an inter-lane region may be added 510.

In either outcome of step 508, obstacles are detected 512 using the sensing systems in a conventional manner: vehicles and obstacles may be identified in images from the imaging devices 124, obstacles may be identified in point clouds from a LIDAR sensor, approaching vehicles may be identified from reflections detected by a RADAR or SONAR system, and the like. Obstacles sensed using the various devices 124, 126, 128 516 are also added to the obstacle set. Collision avoidance is performed 514 with respect to the obstacle set. As noted above, this may include detecting potential collisions and activating one or more of a steering actuator 138a, accelerator actuator 138b, and brake actuator 138c in order to avoid the obstacles of the obstacle set as well as guiding the vehicle to an intended destination. Where the obstacle set includes a lane-splitting vehicle determined to be present at step 508, performing 514 collision avoidance may include refraining from performing lane changes or other movements into the inter-lane region, particularly on a side of the vehicle where the lane-splitting vehicle is located. Once the lane-splitting vehicle is no longer detected, movement into the inter-lane region may be permitted for purposes of turns, lane changes, etc.

In some embodiments, in response to detection of a lane-splitting vehicle at step 508, an alert may be output in the form of a flashing light, audible tone, spoken message, text on a display, or the like that indicates one or both of the fact that a lane-splitting vehicle is approaching and that which side of the vehicle it is on. Once the lane-splitting vehicle is no longer detected, the alert may be discontinued.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. A method comprising:
   defining, by a computer system, a three dimensional (3D) model including a road, buildings, a plurality of vehicles, a lane-splitting vehicle, and a subject vehicle positioned on the road and including two or more sensor locations;
   simulating, by the computer system, two or more sensor outputs from sound from the lane-splitting vehicle incident on the two or more sensor locations of the subject vehicle in the 3D model, the simulating comprising simulating movement of the subject vehicle and the lane-splitting vehicle and modeling reflection of the sound from the lane-splitting vehicle, from the road, from the buildings, and from the plurality of vehicles;
   training, by the computer system, a machine-learning model to both identify and locate lane-splitting vehicles using a location of the lane-splitting vehicle in the 3D model over time and the two or more sensor outputs;
   providing a vehicle including a vehicle controller and two or more microphones;
   programming the vehicle controller with the machine-learning model;
   receiving, by the vehicle controller, two or more audio streams from the two or more microphones;
   inputting, by the vehicle controller, the two or more audio streams to the machine-learning model;
   (a) determining, by the vehicle controller, that the machine-learning model indicates that the two or more audio streams currently indicate a lane-splitting vehicle is present; and
   in response to (a) at least one of outputting an alert and refraining from causing the vehicle to enter an inter-lane region.

2. The method of claim 1, further comprising:
   defining on the subject vehicle one or more camera locations;
   simulating detection of images at the one or more camera locations; and
   training the machine-learning model using both the images and the two or more sensor outputs.

3. The method of claim 2 further comprising:
   defining on the subject vehicle a RADAR sensor location;
   simulating a RADAR sensor output according to the 3D model; and
   training the machine learning model using all of the images, the RADAR sensor output, and the two or more sensor outputs.

4. The method of claim 3, further comprising:
   defining on the subject vehicle a LIDAR sensor location;
   simulating a sequence of point clouds detected from the LIDAR sensor location of the 3D model; and
   training the machine learning model using all of the images, the RADAR sensor output, the sequence of point clouds, and the two or more sensor outputs.

5. The method of claim 1, wherein defining the 3D model further includes defining velocities for the plurality of vehicles, the lane-splitting vehicle and the subject vehicle.

6. The method of claim 1, wherein the machine-learning model is a deep neural network.

7. The method of claim 1, wherein simulating the two or more sensor outputs from the sound of the plurality of vehicles incident on the two or more sensor locations comprises simulating Doppler effects and propagation distances of the sound.

8. The method of claim 1, where the lane-splitting vehicle is modeled as a lane-splitting motorcycle emitting engine noises characteristic of a motorcycle.

9. The method of claim 1, further comprising:
   (b) determining, by the vehicle controller, subsequent to (a) that the machine-learning model indicates that the two or more audio streams do not currently indicate a lane-splitting vehicle is present;
   in response to (b), discontinuing outputting the alert by the vehicle controller and permitting, by the vehicle controller, movement into the inter-lane region.

10. A system comprising one or more processors and one or more memory devices coupled to the one or more processors, the one or more memory devices storing executable code effective to:
    define a three dimensional model including a road, buildings, a plurality of vehicles, a lane-splitting vehicle, and a subject vehicle including two or more sensor locations positioned on the road;
    simulate two or more sensor outputs from sound from the plurality of vehicles incident on the two or more sensor locations by simulating movement of the subject vehicle and the lane-splitting vehicle and modeling reflection of the sound from the lane-splitting vehicle from the road, buildings, and the plurality of vehicle; and
    train a machine-learning model using a location of the lane-splitting vehicle over time and the two or more sensor outputs;
    further comprising a vehicle including a vehicle controller and two or more microphones;
    wherein the vehicle controller is programmed with the machine-learning model;
    wherein the vehicle controller is further programmed to:
    receive two or more audio streams from the two or more microphones;
    input the two or more audio streams to the machine-learning model;
    if the machine-learning model indicates that the two or more audio streams currently indicate a lane-splitting vehicle is present, at least one of output an alert by the vehicle controller and refrain from moving, by the vehicle controller, the vehicle into an inter-lane region.

11. The system of claim 10, wherein the executable code is further effective to cause the one or more processors to:
    define on the subject vehicle one or more camera locations;

simulate detection of images at the one or more camera locations; and train the machine-learning model using both the images and the two or more sensor outputs.

12. The system of claim 11, wherein the executable code is further effective to cause the one or more processors to:

define on the subject vehicle a RADAR sensor location;

simulate a RADAR sensor output according to the 3D model; and train the machine learning model using all of the images, the RADAR sensor output, and the two or more sensor outputs.

13. The system of claim 12, wherein the executable code is further effective to cause the one or more processors to:

define on the subject vehicle a LIDAR sensor location;

simulate a sequence of point clouds detected from the LIDAR sensor location of the 3D model; and train the machine learning model using all of the images, the RADAR sensor output, the sequence of point clouds, and the two or more sensor outputs.

14. The system of claim 10, wherein the executable code is further effective to cause the one or more processors to define the 3D model by defining velocities for the plurality of vehicles, the lane-splitting vehicle and the subject vehicle.

15. The system of claim 10, wherein the machine-learning model is a deep neural network.

16. The system of claim 10, wherein the executable code is further effective to cause the one or more processors to simulate the two or more sensor outputs from the sound of the plurality of vehicles incident on the two or more sensor locations by simulating Doppler effects and propagation distances of the sound.

17. The system of claim 10, wherein the executable code is further effective to cause the one or more processors to model the lane-splitting vehicle as a lane-splitting motorcycle emitting engine noises characteristic of a motorcycle.

18. The system of claim 10, wherein the executable code is further effective to cause the one or more processors to:

if the machine-learning model indicates that the two or more audio streams currently indicate a lane-splitting vehicle is present, at least one of refrain from outputting the alert by the vehicle controller and permit, by the vehicle controller, movement into the inter-lane region.

* * * * *